(12) United States Patent
Kondo et al.

(10) Patent No.: US 6,747,317 B2
(45) Date of Patent: Jun. 8, 2004

(54) SEMICONDUCTOR DEVICE

(75) Inventors: Masao Kondo, Kawasaki (JP);
Kazuaki Kurihara, Kawasaki (JP);
Kenji Maruyama, Kawasaki (JP);
Hideki Yamawaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/093,519

(22) Filed: Mar. 11, 2002

(65) Prior Publication Data

US 2003/0085426 A1 May 8, 2003

(30) Foreign Application Priority Data

Nov. 2, 2001 (JP) ........................................ 2001-338408

(51) Int. Cl.⁷ .............................................. H01L 27/01
(52) U.S. Cl. .................. 257/347; 257/352; 257/353; 257/507; 438/149; 438/479; 438/517
(58) Field of Search ................. 257/347–354, 257/507; 438/149, 479, 517

(56) References Cited

U.S. PATENT DOCUMENTS

| | | | | |
|---|---|---|---|---|
| 5,403,673 A | * | 4/1995 | Haga et al. ................. | 428/688 |
| 5,420,102 A | * | 5/1995 | Harshavardhan et al. ... | 505/237 |
| 5,472,510 A | * | 12/1995 | Harshavardhan et al. ... | 118/730 |
| 5,514,484 A | * | 5/1996 | Nashimoto .................. | 428/700 |
| 5,773,843 A | * | 6/1998 | Nakamura et al. ........... | 257/30 |
| 5,801,105 A | * | 9/1998 | Yano et al. ................. | 438/785 |
| 5,837,053 A | * | 11/1998 | Wang et al. .................. | 117/7 |
| 5,879,811 A | * | 3/1999 | Tanaka et al. .............. | 428/428 |
| 6,150,684 A | * | 11/2000 | Sone .......................... | 257/295 |

FOREIGN PATENT DOCUMENTS

JP 10-107216 4/1998

* cited by examiner

*Primary Examiner*—David Nelms
*Assistant Examiner*—Andy Huynh
(74) *Attorney, Agent, or Firm*—Westerman, Hattori, Daniels & Adrian, LLP

(57) ABSTRACT

The present invention provides a semiconductor device comprising a single-crystal silicon substrate; and a single-crystal oxide thin film having a perovskite structure formed through epitaxial growth on the single-crystal silicon substrate. The single-crystal oxide thin film is directly in contact with a surface of the single-crystal silicon substrate, and contains a bivalent metal that is reactive to silicon.

6 Claims, 17 Drawing Sheets

SEMICONDUCTOR DEVICE

BACKGROUND OF THE INVENTION

The present invention generally relates to semiconductor devices, and, more particularly, to a semiconductor device that has an oxide film formed by a silicon substrate and an epitaxial film grown on the silicon substrate.

Conventionally, the formation of an oxide film on a silicon substrate has been commonly performed. For most cases, the oxide film is an amorphous film, and is mainly employed as an insulating film or a dielectric film.

In a semiconductor device that utilizes the properties of an oxide film, such as a ferroelectric memory, a crystallized oxide film is employed to realize desired functions. Some oxide crystals exhibit many properties including not only insulation and dielectric properties but also ferroelectricity, piezoelectricity, pyroelectricity, and superconductivity. By forming oxide crystals having these properties as a thin film on a single-crystal silicon substrate, a device having various functions such as a memory, a sensor, and a filter, can be obtained. These functions derive from the properties of the oxide crystals. In an amorphous state, however, the oxide films cannot exhibit the properties or can exhibit only a part of the properties.

A ferroelectric film used in a ferroelectric memory obtains the above properties through crystallization in the existence of oxygen at a temperature of several hundred degrees centigrade. However, a conventional ferroelectric film is a polycrystalline film, in which the orientations of crystals in a direction perpendicular to the substrate, for instance, are aligned, but the orientations of crystals in other directions are generally at random, resulting in defects with the grain boundaries, for instance. For this reason, a semiconductor device including a conventional crystalline oxide film only has a limited ability to exhibit the properties of the oxide crystal.

Meanwhile, it has been very difficult to form an oxide film having an epitaxial orientation in which the crystal orientations are aligned not only in a direction perpendicular to the substrate surface but also in a direction parallel to the substrate surface.

To develop an epitaxial oxide thin film on a single-crystal silicon substrate, it is necessary to utilize the orientations on the surface of the single-crystal silicon substrate. However, a single-crystal silicon substrate has the same chemical properties as metals. If exposed to an oxygen atmosphere at a high temperature, the surface of a single-crystal silicon substrate is quickly oxidized to form a silicon oxide (SiOx) film. Since a silicon oxide film is amorphous and does not have a crystal orientation, an epitaxial oxide thin film cannot grow on a silicon oxide film. It is also essential for epitaxial growth that the reaction and diffusion between a growing thin film and a single-crystal silicon substrate should be minimized. For this reason, not all oxides can be formed through epitaxial growth on a single-crystal silicon substrate. Materials that are known to date as suitable for epitaxial growth on a single-crystal silicon substrate only include rare earth element oxides such as yttrium fully stabilized zirconia (YSZ: see J.Appl.Phys. vol. 67, (1989) pp. 2447), magnesia spinel (MgAl$_2$O$_4$: ISSCC Digest of Tech. Papers (1981) pp. 210), and cerium oxide (CeO$_2$: Appl.Phys.Lett, vol. 56, (1990) pp. 1332), and strontium titanate (StTiO3: Jpn.J.Appl.Phys, 30 (1990) L1415).

The index of crystal quality of an epitaxial oxide thin film formed on a silicon substrate is a half value width that is obtained through X-ray diffraction (Full Width at Half Maximum, FWHM). A half value width is a value determined from a rocking curve obtained by scanning fixed 2 θ axes of an X-ray peak. More specifically, the half value width (FWHM) is determined by the peak width at a half of the strength of the peak top of the rocking curve. This indicates the degree of crystal tilt in the thin film. A smaller value indicates properties similar to those of a single-crystal material, which exhibits better crystallization and orientation. With aligned orientations of crystals in a thin film, the electric properties (such as leak properties with improved hysteresis properties) are improved. It is therefore essential that a thin film having as small half value width (FWHM) as possible should be produced for suitable application to a device.

Materials having perovskite structures, including barium titanate, are ferroelectric materials that are desirable in terms of piezoelectricity, dielectricity, pyroelectricity, semiconductivity, and electric conductivity. However, it has been conventionally difficult to develop a material having a perovskite structure through epitaxial growth directly on a single-crystal silicon substrate. This is because an amorphous-phase SiOx film or a reaction phase such as silicide is formed on a single-crystal silicon substrate.

The only epitaxial perovskite thin film conventionally employed and formed on a single-crystal silicon substrate is strontium titanium (SrTiO$_3$). A metal strontium film as an intermediate layer is interposed between a strontium titanium thin film and a single-crystal silicon substrate. Since titanium and silicon are reactive to each other, a strontium titanate film is formed to prevent reaction between titanium and silicon. More specifically, after a metal strontium film is formed on the surface of a silicon substrate, strontium and titanium are supplied in the existence of oxygen so as to produce a strontium titanate film. If the metal strontium film as an intermediate layer is thin enough, the titanium diffuses into the metal strontium film during the formation of a SrTiO$_3$ film. As a result, a SrTiO$_3$ film that appeases to have developed through epitaxial growth directly on the single-crystal silicon substrate can be obtained.

To develop a strontium titanate film through epitaxial growth in the above manner, a process control is necessary at the atomic layer level, and, therefore, a molecular beam epitaxy (MBE) technique is employed. Alternatively, Japanese Laid-Open Patent Application No. 10-107216 discloses a method of forming a strontium titanate (SrTiO$_3$) film. More specifically, high-vacuum laser ablation is performed on a SrO target in a high vacuum of $10^{-8}$ Torr, so as to form a strontium oxide (SrO) film as an intermediate layer. A strontium titanate (SrTiO$_3$) film is then formed on the SrO film. If the SrO intermediate layer is thin enough, the titanium diffuses into the SrO intermediate layer during the formation of the SrTiO$_3$ film. As a result, it appears that the SrTiO$_3$ film has developed through epitaxial growth directly on the single-crystal silicon substrate.

Alternatively, another method has been suggested in which an intermediate layer is formed to prevent the reaction between a single-crystal silicon substrate and a perovskite oxide, and the formation of a SiOx phase. Intermediate layers that are known to date include yttria partially stabilized zirconia (YSZ: J.Appl.Phys. 67 (1989) pp. 2447) and magnesia spinel (MgAl$_2$O$_4$: ISSCC Digest of Tech. Papers (1981) pp. 210). With any of these intermediate layer, a 2-layered structure in which the intermediate layer and a perovskite film are laminated in this order on a single-crystal silicon substrate is obtained.

A yttria partially stabilized zirconia (YSZ) thin film formed through epitaxial growth on a single-crystal silicon substrate is obtained by a pulse laser deposition technique using YSZ ceramics as a target. Where a perovskite film is formed on such a YSZ film on a single-crystal silicon substrate, an epitaxial phenomenon in which the (011)-plane of the perovskite film is orientated in a direction corresponding to the (001)-plane of the YSZ film can be seen. However, the spontaneous polarization direction of a tetragonal perovskite film is the <001>-direction. If the (011)-plane of a perovskite film is orientated, the spontaneous polarization direction is tilted by 45 degrees with respect to the substrate surface. In such a case, the apparent polarization in the direction perpendicular to the substrate surface decreases, which is disadvantageous in application to a FeRAM or a piezoelectric actuator.

Conventionally, it has been known that an oxide thin film containing a rare earth element such as cerium oxide ($CeO_2$) or yttrium oxide ($Y_2O_3$) can be formed through epitaxial growth on a single-crystal silicon substrate by a pulse laser deposition technique using a composite material of the rare earth element as a target. However, such an oxide thin film containing a rare earth element is (011)-orientated with respect to a single-crystal silicon substrate. For this reason, it is difficult to form a (001)-orientated perovskite film through epitaxial growth on such an oxide thin film.

There is also a known method of forming a $MgAl_2O_4$ film through epitaxial growth on a single-crystal silicon substrate by a CVD technique. As disclosed in J.Appl.Phys. vol. 66 (1989) pp. 5826, a perovskite film formed on a $MgAl_2O_4$ film in this manner has the <001>-direction aligned with respect to the <001>-direction of $MgAl_2O_4$ film. This is advantageous in application to a FeRAM or a piezoelectric actuator.

As described above, the only known perovskite oxide film that can be formed through epitaxial growth directly on a single-crystal silicon substrate is a strontium titanate film formed with a thin intermediate layer. Also, the methods of producing such a film only includes a MBE technique that requires a high vacuum of $10^{-12}$ Torr or lower, and a pulse laser deposition technique that also requires a high vacuum. A high-vacuum pulse laser deposition technique requires a vacuum of $10^{-8}$ Torr or lower, and, therefore, a metal-sealed vacuum device is necessary to perform high-vacuum pulse laser deposition. Furthermore, such a high-vacuum process requires maintenance such as baking, and lowers the throughput, resulting in an increase of production costs.

In the MBE technique, metal strontium is used as a raw material. However, an alkaline earth metal such as metal strontium quickly reacts to water, and therefore needs to be stored in oil. With metallic magnesium, there is also a problem in safety, because metallic magnesium easily starts fire. Meanwhile, strontium oxide is used as a target used in a high-vacuum pulse layer deposition technique. However, an oxide containing an alkaline earth metal such as strontium oxide has deliquescence, and absorbs moisture from the air to change into a hydroxide. Such a hydroxide containing an alkaline earth metal is a strong alkali and therefore corrodes the device. As described so far, with the conventional methods and techniques, there are problems in safety and maintenance, as intensive care must be taken in handling raw materials.

In the MBE technique, it is difficult to form a thick intermediate layer such as a perovskite film or a strontium oxide film, because each layer is atomically laminated on one another. In the CVD technique, on the other hand, an organic metal material is supplied in the existence of oxygen, and is decomposed on the substrate surface so as to form a deposition film on the silicon substrate. A cyclepentadiene compound is often employed as the organic metal material. Since such a material does not contain oxygen atoms, however, it is difficult to combine with oxygen at the time of decomposition, often resulting in precipitation of the metal. While an oxide does not easily react to metal, two metallic materials easily diffuse into the substrate to form an alloy. Such a reaction layer disturbs the surface crystal, and therefore hinders the epitaxial growth of a single-crystal oxide thin film on the surface. Further, it is difficult to maintain a high-volume chamber at a high vacuum in accordance with the MBE technique and the high-vacuum pulse laser deposition technique. As a result, it is also difficult to form an oxide film through epitaxial growth on a single-crystal silicon substrate having a large diameter.

Japanese Laid-Open Patent Application No. 6-122597 discloses a structure in which an organic salt such as carbonate, nitrate, or sulfate is used as a target for pulse-laser deposition of an oxide that is unstable in the air at room temperature. In accordance with this technique, an inorganic salt contained in the target is decomposed by laser irradiation, and adheres onto the substrate as a crystalline oxide thin film. In this technique, however, the non-decomposed part of the inorganic salt may also adhere onto the substrate, or a nitride oxide gas or sulfur oxide gas may react to the silicon substrate. To obtain a high-quality crystalline thin film, it is preferable to perform film formation in a vacuum space. However, an inorganic salt often contains water of crystallization in the crystals. When decomposed by laser irradiation, such crystallization water greatly reduces the vacuum. The above facts disturb the crystal structure of the oxide, and become a hindrance to formation of a high-quality crystalline thin film.

SUMMARY OF THE INVENTION

A general object of the present invention is to provide semiconductor devices, methods of forming an epitaxial film, and laser ablation devices in which the above disadvantages are eliminated.

A more specific object of the present invention is to provide a method of forming a single-crystal oxide thin film through epitaxial growth on a single-crystal silicon substrate, and a semiconductor device that includes such a single-crystal oxide thin film formed on a single-crystal silicon substrate.

Another specific object of the present invention is to provide a method of forming a single-crystal oxide epitaxial thin film having a perovskite structure with a high crystal orientation on a single-crystal silicon substrate at such a vacuum that can be attained by an O-ring seal generally used in a simple vacuum device.

The above objects of the present invention are achieved by a semiconductor device that includes: a single-crystal silicon substrate; and a single-crystal oxide thin film having a perovskite structure formed through epitaxial growth on the single-crystal silicon substrate. In this semiconductor device, the single-crystal oxide thin film is directly in contact with a surface of the single-crystal silicon substrate, and contains a bivalent metal that is reactive to silicon.

The above objects of the present invention are also achieved by a semiconductor device that includes: a single-crystal silicon substrate; a single-crystal oxide thin film having a perovskite structure formed through epitaxial growth on the single-crystal silicon substrate; and an amorphous silicon layer interposed between the single-crystal silicon substrate and the single-crystal oxide thin film.

The above objects of the present invention are also achieved by a semiconductor device that includes: a single-crystal silicon substrate; a first single-crystal oxide thin film having a sodium chloride structure formed through epitaxial growth on the single-crystal silicon substrate; and a second single-crystal oxide thin film having a perovskite structure formed through epitaxial growth on the first single-crystal oxide thin film. This semiconductor device is characterized by the first single-crystal oxide thin film selected from the group consisting of CaO, SrO, and BaO.

The above objects of the present invention are also achieved by a semiconductor device that includes: a single-crystal silicon substrate; a first single-crystal oxide thin film having a sodium chloride structure formed through epitaxial growth on the single-crystal silicon substrate; a second single-crystal oxide thin film having a perovskite structure formed through epitaxial growth on the first single-crystal oxide thin film; and an amorphous layer interposed between the single-crystal silicon substrate and the first single-crystal oxide thin film.

The above objects of the present invention are also achieved by a method of forming an epitaxial film, which method includes the steps of: forming a plume by irradiating a target containing a bivalent metal carbonate with a laser beam; developing a bivalent metal oxide film from the bivalent metal carbonate through epitaxial growth on a single-crystal silicon substrate set in a passage of the plume; and heating a surface of the target with an independent heat source different from the laser beam, thereby producing a single-crystal oxide epitaxial film.

The above objects of the present invention are also achieved by a laser ablation device that includes: a processing chamber that is exhausted by an exhausting system; a processed substrate that is held within the processing chamber; a target that is provided in the processing chamber and faces the processed substrate; an optical window that is provided in the processing chamber and corresponds to an optical path of the laser beam irradiating the target; and a heat source that is provided in the processing chamber and covers a space between the processed substrate and the target.

In accordance with the present invention, when a perovskite oxide film is formed through epitaxial growth on a single-crystal silicon substrate by a laser ablation technique, with a single-crystal oxide film having a sodium chloride structure formed as an intermediate layer, carbonate is used as an ablation target for the oxide film as the intermediate layer. The surface of the target is heated with a heat source other than a laser beam, or, more preferably, the plume itself is heated by the heat source, so that an oxide film containing a metal reactive to the silicon substrate can be formed as the intermediate layer through epitaxial growth. A perovskite oxide film is then formed through epitaxial growth on such an intermediate layer, thereby forming a perovskite single-crystal oxide thin film containing a bivalent metal reactive to silicon on the silicon substrate.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 1:
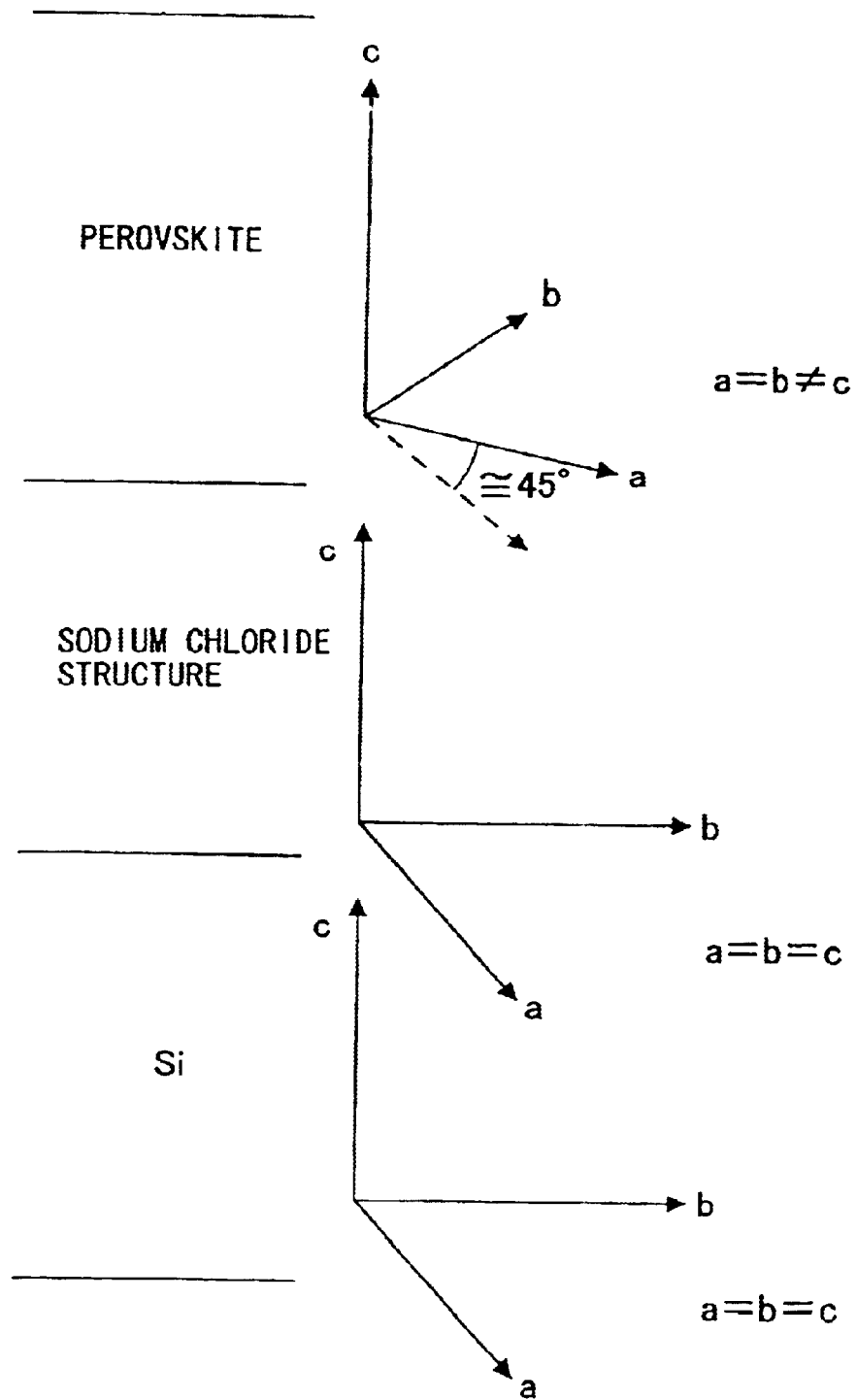
FIG. 1 shows the crystal orientation of an epitaxial film obtained in accordance with the present invention.

The inventor(s) of the present invention made an intensive study on the intermediate layer that is interposed between a (001)-orientated single-crystal oxide film having a perovskite structure and the (001)-plane of a single-crystal silicon substrate on which the single-crystal oxide film is developed through epitaxial growth. As a result, it was found that, when a SrO film, a CaO film, or a BaO film having a sodium chloride structure is interposed as the intermediate layer, the epitaxial growth of the intermediate layer film was seen substantially in the corresponding directions of a-axis, b-axis, and c-axis in a so-called cube-on-cube relationship with the silicon substrate, as shown in FIG. 1. It was also found that, when an oxide thin film having a perovskite structure formed through epitaxial growth on the above intermediate layer, the c-axis direction of the formed perovskite film corresponds to the c-axis direction of the intermediate layer, whereas the a-axis and b-axis of the perovskite film are rotationally shifted from the a-axis and b-axis of the intermediate layer by approximately 45 degrees. It is believed that the rotational shifting occurs to maintain the lattice constant conformity between the perovskite film and the intermediate layer having a sodium chloride structure.

The above perovskite film maintains a (001)-orientation, and has a polarization direction at right angle with respect to the surface of the silicon substrate. Accordingly, the piezoelectric effect and the ferroelectric hysteresis become the maximum with such a (001)-orientated film, which can be effectively employed in a FeRAM or a piezoelectric actuator.

An alkaline earth metal easily forms an oxide by taking oxygen from silicon. For this reason, a sodium chloride structure oxide containing an alkaline earth metal formed as an intermediate layer in contact with a silicon substrate can restrict the formation of a SiOx amorphous layer on the interface between the intermediate layer and the silicon substrate. Meanwhile, an alkaline earth metal oxide having a sodium chloride structure is unstable and reactive to moisture or carbon dioxide in the air. This makes an alkaline earth metal difficult to handle, and causes a problem in presenting unstable film properties in a semiconductor device.

In the present invention, the intermediate layer and perovskite film is formed by a laser ablation technique, and an inorganic salt such as carbonate is used, instead of an alkaline earth metal or oxide, as an ablation target. If a pulse layer deposition process is performed directly on an inorganic salt target, however, the inorganic salt adheres to the substrate, and hinders the formation of a thin film having a high crystal orientation. In order to solve this problem, the following experiments were conducted in accordance with the present invention.

1) A carbonate target was temporarily heated at 700° C. or higher so as to decompose the carbonate on the surface of the carbonate target into oxide and carbon dioxide, which were subjected to laser ablation.
2) The carbonate target was introduced into an oxygen atmosphere chamber, and laser ablation was conducted at 700° C.
3) The carbonate target was irradiated with a laser beam so as to generate a plume, and the plume was heated to facilitate the decomposition of the carbonate into oxides.

By conducting any of the above processes, the carbonated on the target can be effectively decomposed into oxide and carbon dioxide, and an alkaline earth metal oxide film having an excellent crystallization can be formed through epitaxial growth on the silicon substrate. In place of carbonate, nitrate or sulfate can be employed as a target, but alkaline earth metal nitrate has a melting point of approximately 500° C. and starts decomposing into oxide at this temperature. Since this melting point is lower than the thin-film deposition temperature (between 600° C. and 800° C.), it is necessary with a nitrate target to change the deposition substrate temperature and the target temperature in a laser ablation device, and the structure of the deposition device becomes more complicated. As for sulfate, the decomposition temperature is approximately 1100° C., which is higher than the deposition temperature. If the temperature of the sulfate target is lowered to the deposition substrate temperature, the decomposition rate becomes lower and therefore disadvantageous. For these reasons, carbonate is considered to be the most preferable as a target.

Figure 2:
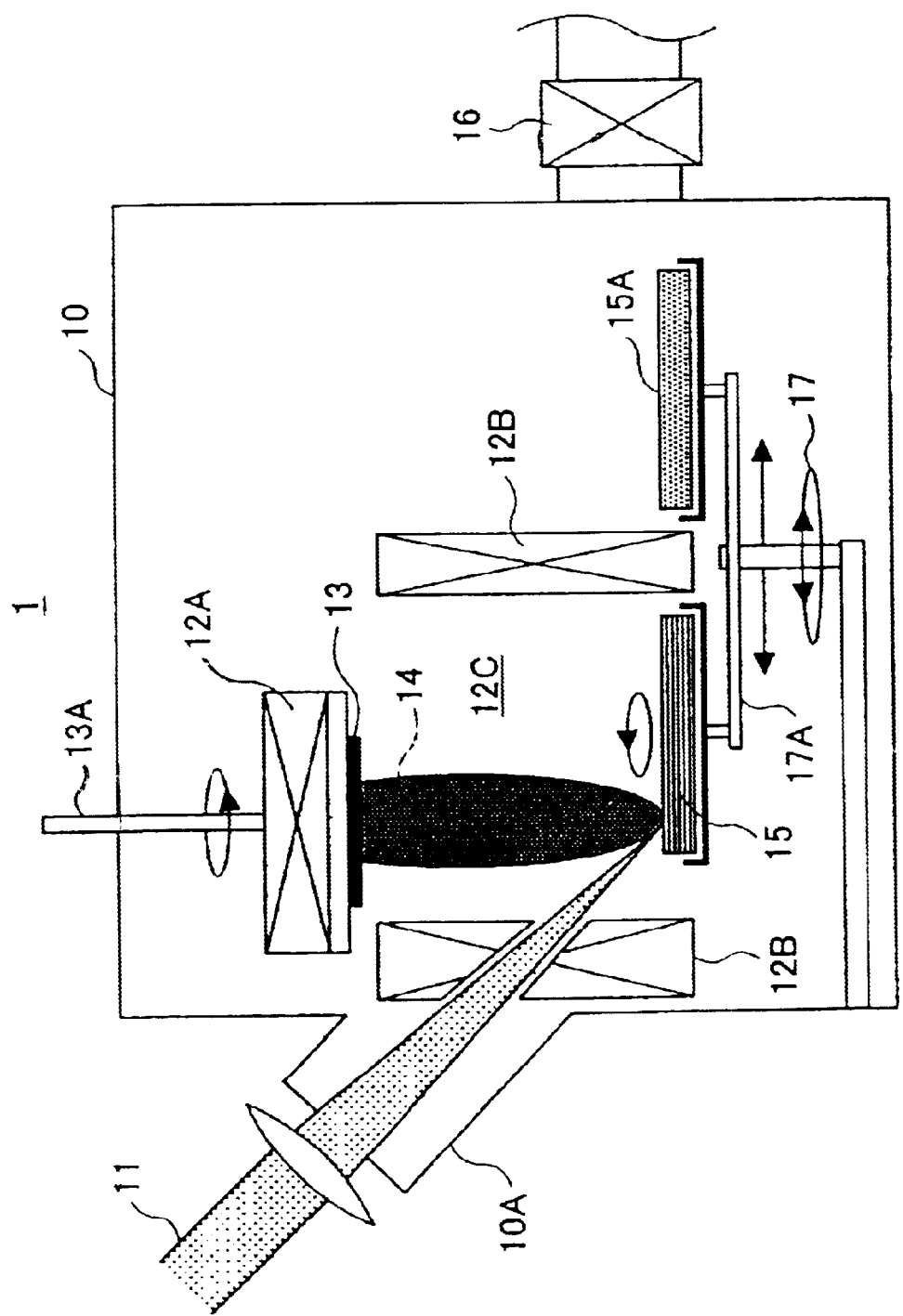
FIG. 2 shows the structure of a laser ablation device used in accordance with the present invention.

FIG. 2 shows the structure of a laser ablation device 1 used in accordance with the present invention. As shown in FIG. 2, the laser ablation device 1 includes a processing chamber 10 that is exhausted by a pump 16, and, in the processing chamber 10, a single-crystal silicon substrate is held as a processed substrate 13 on a heater 12A set on a rotational axis 13A.

The processing chamber 10 also accommodates a target 15 facing the processed substrate 13. Upon the target 15, a high-powered laser beam 11 is focused through a window 10A. As the laser beam 11, KrF or ArF excimer laser, femtosecond laser, or Nd:YAG higher harmonic laser can be used.

With the irradiation with the laser beam 11, the surface of the target 15 is instantly atomized, and a flame 14 called "plume" is formed as a result. The processed substrate 13 is set in a passage of the plume 14, and the oxide that has been atomized on the surface of the target 15 and transported in the form of a plume is deposited through epitaxial growth on the processed substrate 13.

The target 15 is preferably made of a sintered body of carbonate, and spontaneously rotates during the irradiation with the laser beam 11 so that the entire surface can be irradiated with the laser beam 11. The target 15 is held on a rotational arm 17A supported by the rotational axis 17, but the rotation of the rotational axis 17 can move a next target 15A to the irradiation point of the laser beam 11.

In the laser ablation device 10 shown in FIG. 2, a space 12C between the target 15 and the processed substrate 13 is covered with a heater 12B, which controls the temperature of the space 12C at approximately 800° C. By controlling the temperature of the space 12C, the heater 12B heats the target 15, and an alkaline earth metal oxide is formed on the surface of the target 15. The oxide formed in this manner is more stable than carbonate, and can be transported inside the plume 14 and deposited on the processed substrate 13. Also, with the heater 12B heating the plume 14 itself, the chemical stability of the oxide clusters being transported in the plume 14 can be increased.

The oxide that has reached the processed substrate 13 in the above manner does not easily react to silicon that constitutes the processed substrate 13. The formation of the oxide requires an oxygen partial pressure of only $10^{-1}$ Torr or so. On the contrary, the conventional formation of oxide by a chemical vapor deposition (CVD) technique requires an oxygen partial pressure of several 2 to 10 Torr to decompose an organic metal raw material. In the laser ablation device shown in FIG. 2, therefore, an amorphous SiOx layer can be prevented from forming on the surface of the silicon substrate 13, and a high-quality alkaline earth metal oxide thin film can be formed through epitaxial growth directly on the surface of the single-crystal silicon substrate 13.

In the laser ablation device shown in FIG. 2, it is also possible to replace the target 15 with the next target 15A made of perovskite structure oxide ceramics, and to form a perovskite structure oxide film on the epitaxial thin film made of alkaline earth metal oxide. Since the surface of the processed substrate 13 is covered with the epitaxial film having a sodium chloride structure on which a perovskite structure oxide can easily grows, a perovskite structure oxide film can be easily formed through epitaxial growth.

Although only the method of heating the targets 15 and 15A during the film formation is shown in the schematic view of FIG. 2, the present invention is not limited to this example. For instance, it is also possible to heat a target in an electric furnace or another processing chamber. In such a method, an oxide formed on a part of the surface of a carbonate target is transported to the processing chamber 10, and the film formation is then conducted. The method of heating both the target 15 and the plume 14 as shown in FIG. 2 is the most effective, but a method of heating either the target 15 or the plume 14 is also effective enough to improve the thin film crystallization.

First Embodiment

Figure 3:
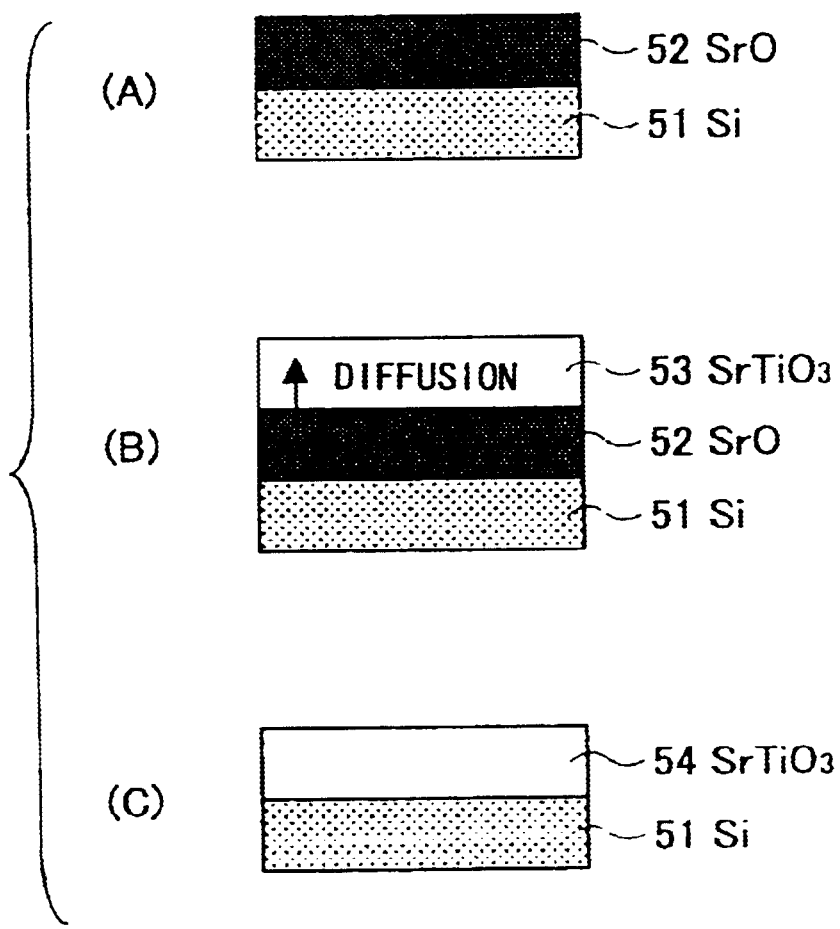
FIGS. 3A through 3C illustrate a process for forming a $SrTiO_3$ epitaxial film on a single-crystal silicon substrate in accordance with a first embodiment of the present invention.

FIGS. 3A through 3C shows an epitaxial growth process of a single-crystal $SrTiO_3$ film on a single-crystal silicon substrate using the laser ablation device in accordance with a first embodiment of the present invention.

As shown in FIG. 3A, by a pulse laser deposition technique using a $SrCO_3$ target as the target 15 shown in FIG. 2, a SrO film 52 having a thickness of 5 to 6 nm is deposited on a silicon substrate 51 from which a natural oxide film has been removed through a high-frequency (HR) process. In the procedure shown in FIG. 3B, by a pulse laser deposition technique using a $SrTiO_3$ target as the target 15, a $SrTiO_3$ film 53 having a thickness of 100 nm is deposited on the SrO film 52. In the procedures shown in FIGS. 3A and 3B, the substrate temperature is set at 800° C. by driving the heater 12A. In the procedures shown in FIG. 3A, laser ablation for the $SrCO_3$ target 15 is performed under a pressure of $1 \times 10^{-5}$ Torr for 0.25 minute, and then in an oxygen atmosphere of $1 \times 10^{-4}$ Torr for 0.25 minute. Meanwhile, in the procedure shown in FIG. 3B, the laser ablation is performed in an oxygen atmosphere of $5 \times 10^{-3}$ Torr for 12 minutes.

In the procedure shown in FIG. 3B, Sr diffuses from the SrO film 52 toward the $SrTiO_3$ film 53 formed thereon, as indicated by the arrow in FIG. 3B. As a result, the SrO film 52 substantially disappears, and a single-crystal $SrTiO_3$ film 54 that is uniform in appearance is formed on the silicon substrate 51, with an epitaxial relation ship maintained between the single crystal $SrTiO_3$ film 54 and the silicon substrate 51, as shown in FIG. 3C.

Figure 4:
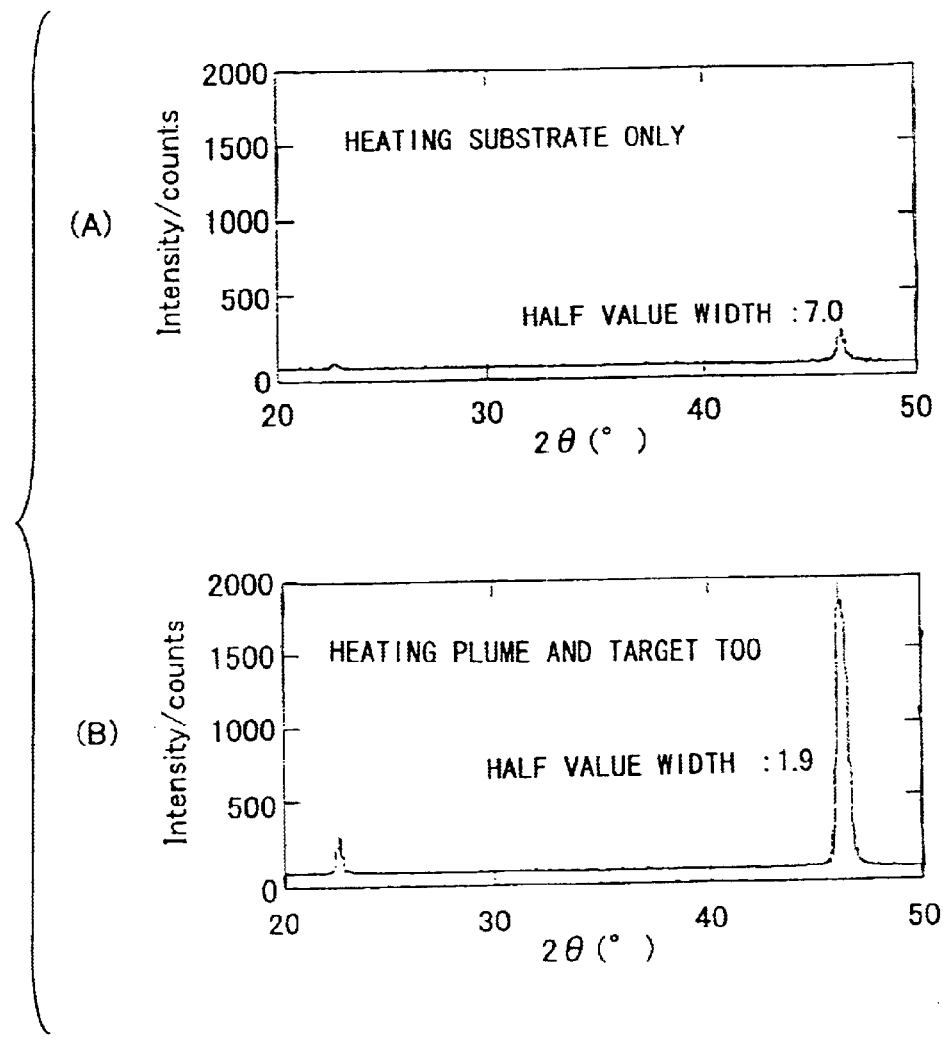
FIG. 4A shows an X-ray diffraction pattern of a $SrTiO_3$ film obtained when the plume is not heated in the device shown in FIG. 2.
FIG. 4B shows an X-ray diffraction pattern of a $SrTiO_3$ film obtained when the plume is heated in the device shown in FIG. 2.

FIG. 4A shows an X-ray diffraction pattern obtained in a case where only the heater 12A shown in FIG. 2 is driven while the heater 12B also shown in FIG. 2 is not driven in the above-described process. FIG. 4B shows an X-ray diffraction pattern in a case where the heater 12A shown in FIG. 2 is driven to maintain the space at approximately 800° C.

As can be seen from FIG. 4A, when only the substrate 13 is heated to obtain a deposition film, the diffraction peak of the obtained $SrTiO_3$ film is low, and the half value width (FWHM) is as great as 7.0. This shows the film quality of the obtained $SrTiO_3$ film is low. As shown in FIG. 4B, when the heater 12B as well as the heater 12A is driven to heat the plume 14 and the target 15 at the same temperature of approximately 800° C. as the substrate 13, the diffraction peak of the obtained $SrTiO_3$ film is very high, reaching a value 10 times as great as the diffraction peak shown in FIG. 4A, and the half value width (FWHM) decreases to 1.9.

Figure 5:
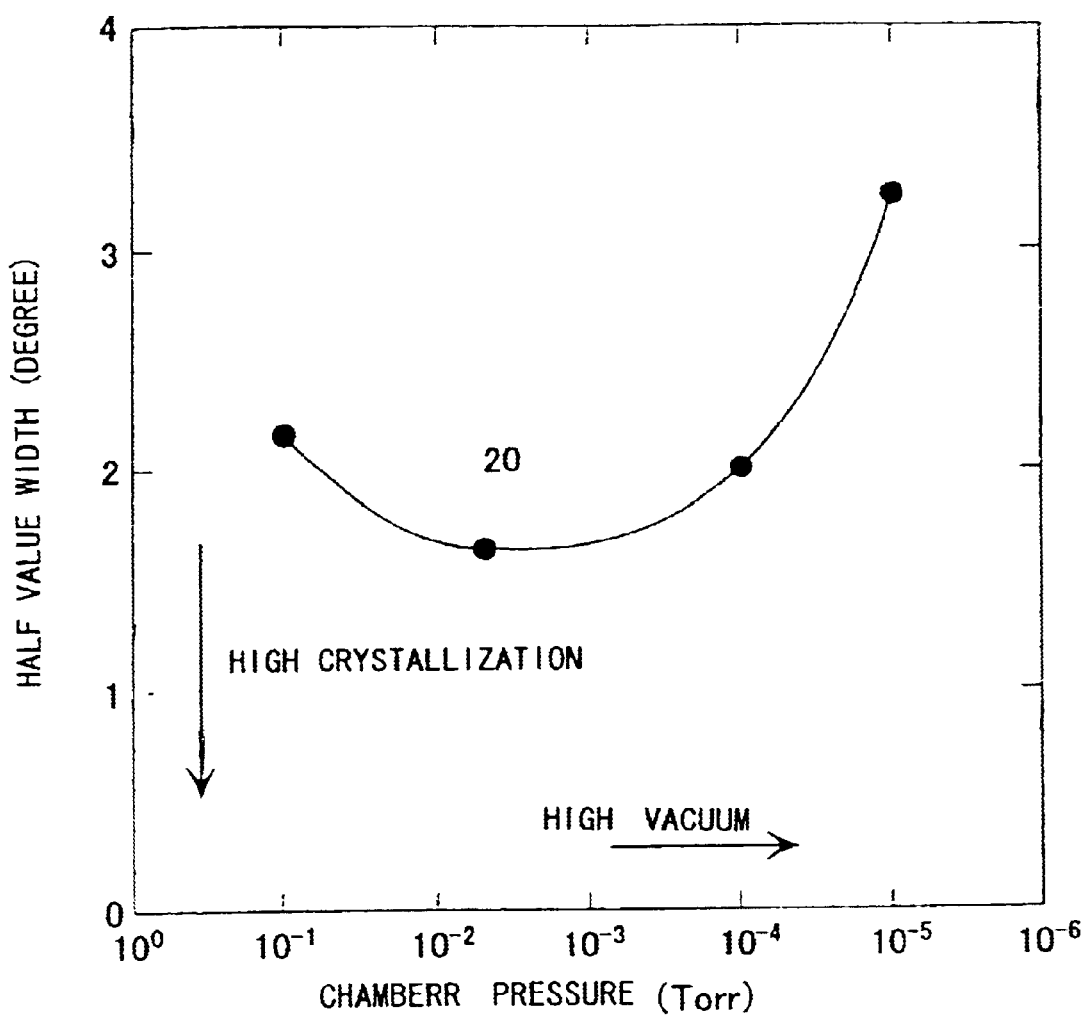
FIG. 5 shows the relationship between an oxygen partial pressure and the half value width of the x-ray rocking curve (FWHM) of a $SrTiO_3$ film obtained with the device shown in FIG. 2.

FIG. 5 shows the relationship between the half value width (FWHM) and the deposition processing pressure of the obtained $SrTiO_3$ epitaxial film.

When conducting laser ablation on a alkaline earth metal oxide as a target, it is generally believed that a high vacuum must be maintained so as to avoid deterioration of the target that is chemically unstable in the air. In the present invention, on the other hand, a stable target made of carbonate is used, and a high-quality perovskite thin film can be formed in a low vacuum.

Referring to FIG. 5, when the pressure in the processing chamber 10 is $10^{-1}$ Torr or higher, or $10^{-4}$ Torr or lower, the X-ray peak half value width (FWHM) of the $SrTiO_3$ film increases. When the pressure in the processing chamber 10 is in a range of $10^{-1}$ Torr to $10^{-4}$ Torr, the half value width becomes the smallest. This implies that an oxygen deficiency in the deposited $SrTiO_3$ film 54 is effectively compensated under an oxygen partial pressure of this range.

In the above manner, an exceptionally high-quality single-crystal $SrTiO_3$ film can be formed through epitaxial growth by heating the plume 14 and the SrO target 15 using carbonate during laser irradiation in the laser ablation device of FIG. 2 in accordance with the first embodiment of the present invention.

Second Embodiment

Figure 6:
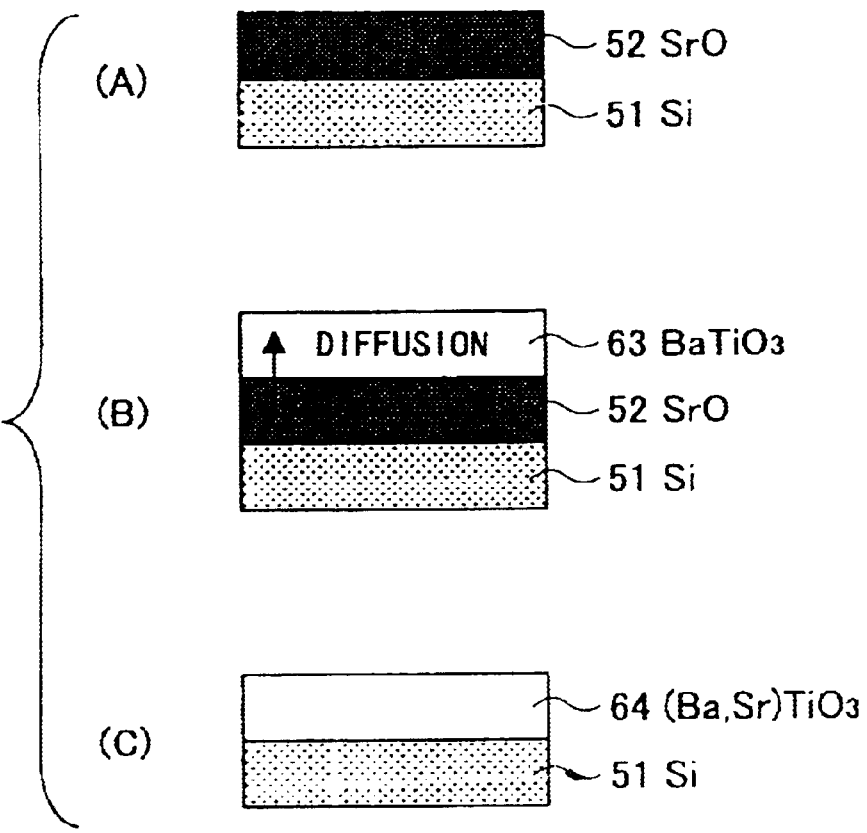
FIGS. 6A through 6C illustrate a process for forming a $(Ba, Sr)TiO_3$ epitaxial film on a single-crystal silicon substrate in accordance with a second embodiment of the present invention.

FIGS. 6A through 6C illustrate the procedures for forming a $(Ba, Sr)TiO_3$ film on a single-crystal silicon substrate in accordance with a second embodiment of the present invention. In the drawings, the same components as in the first embodiment are denoted by the same reference numerals as well, and explanations for those components are omitted from the following description.

Referring to FIG. 6A, a single-crystal SrO film 52 is formed on the single-crystal silicon substrate 51 by driving the heater 12A and the heater 12B of the laser ablation device of FIG. 2 so as to heat the plume 14 and the target 15, as well as the processed substrate 13, at 800° C. In the procedure shown in FIG. 6A, the deposition of the single-crystal SrO film 52 is conducted under a pressure of $1 \times 10^{-5}$ Torr for 8 minutes, and then under a pressure of $5 \times 10^{-4}$ Torr at 800° C. for 0.5 minute.

In this embodiment, the thickness of the single-crystal SrO film is several nanometers or less. In the procedure shown in FIG. 6B, a single-crystal $BaTiO_3$ film 63 having a thickness of approximately 200 nm is formed on the single-crystal SrO film 52 by a pulse laser deposition technique using $BaTiO_3$ as a target. Laser ablation is then conducted in an oxygen atmosphere of $1 \times 10^{-2}$ Torr for 10 minutes.

In the procedure shown in FIG. 6B, the Sr in the SrO film 52 diffuses into the $BaTiO_3$ film 63, which then changes into a single-crystal $(Ba, Sr)TiO_3$ film 64, as shown in FIG. 6C. As s result, the $(Ba, Sr)TiO_3$ film 64 that is directly in contact with the silicon substrate 51 can be obtained, with an epitaxial relationship being maintained between the silicon substrate 51 and the $(Ba, Sr)TiO_3$ film 64.

Figure 7:
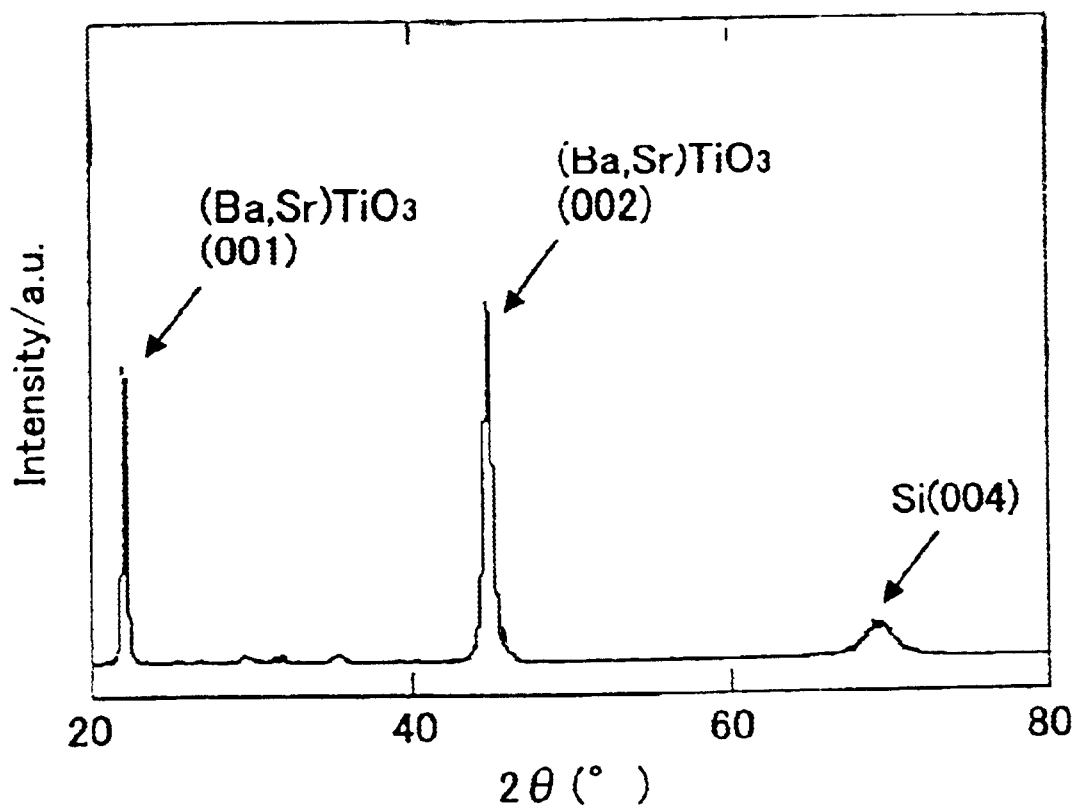
FIG. 7 shows an X-ray diffraction pattern obtained with the structure shown in FIG. 6C.

FIG. 7 shows an X-ray diffraction pattern of the $(Ba, Sr)TiO_3$ film 64 obtained in the above manner.

As shown in FIG. 7, in the above structure, only the reflections from the (001)-plane and the (002)-plane of the $(Ba, Sr)TiO_3$ are observed, while the reflection from the SrO film is not. This implies that the $(Ba, Sr)TiO_3$ film 64 is a single-crystal film having a (001)-orientation.

Figure 8:
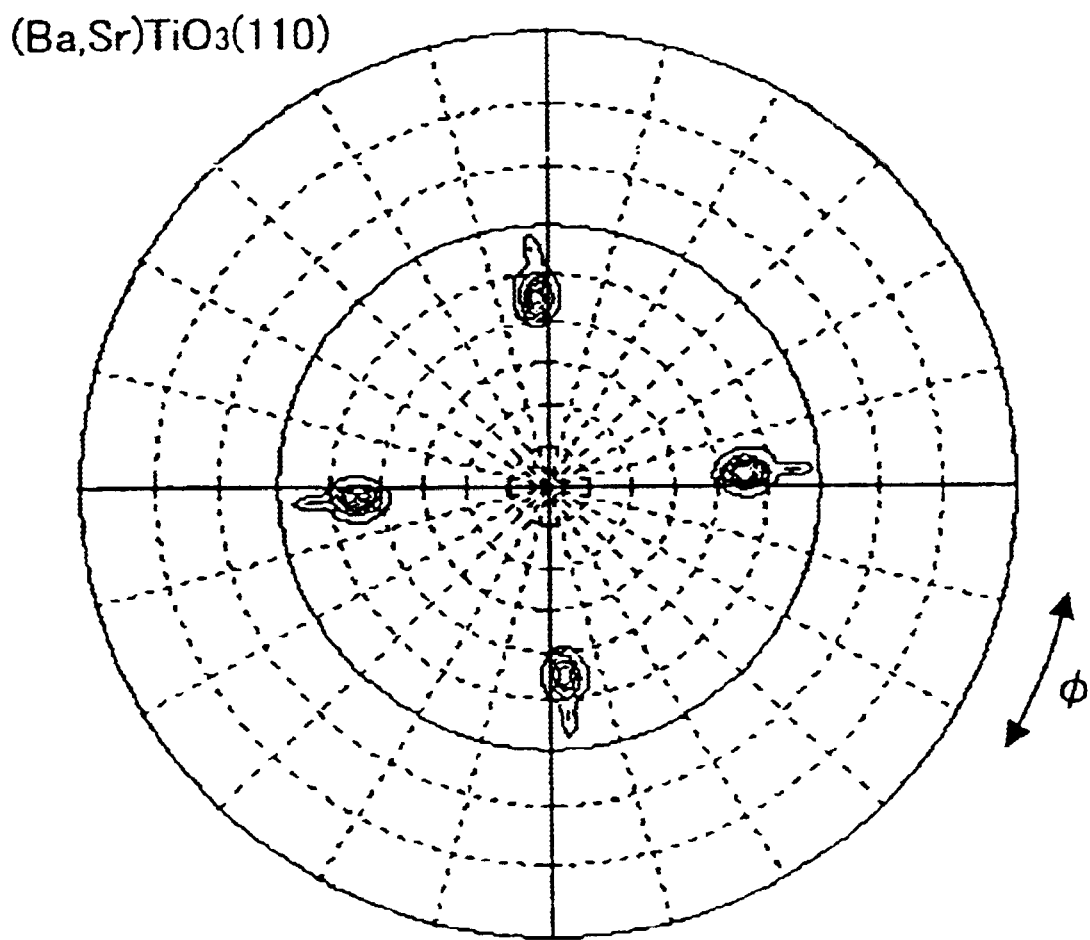
FIG. 8 shows an X-ray pole pattern obtained with the structure shown in FIG. 6C.

FIG. 8 shows the results of X-ray pole measurement conducted on the structure shown in FIG. 6C.

The X-ray pole pattern is a diffraction pattern obtained by tilting and then rotating a sample in a normal line direction with respect to a certain diffraction peak. If the sample is particles or a polycrystalline body, a diffraction peak can be observed, regardless of the tilt angle or the rotation angle. If the sample is a single-crystal film, on the other hand a diffraction peak is observed only with respect to a certain tilt angle and a certain rotation angle.

The X-ray pole pattern is obtained with respect to the (011)-diffraction peak of the $(Ba, Sr)TiO_3$ film 64. In this pattern, four poles corresponding to the (011)-plane are shown, which clearly indicates that the obtained $(Ba, Sr)TiO_3$ film 64 is a single-crystal film and has 4 rotation symmetry axes. It can also be seen from FIG. 8 that the $(Ba, Sr)TiO_3$ film 64 does not have twins formed therein.

Figure 9:
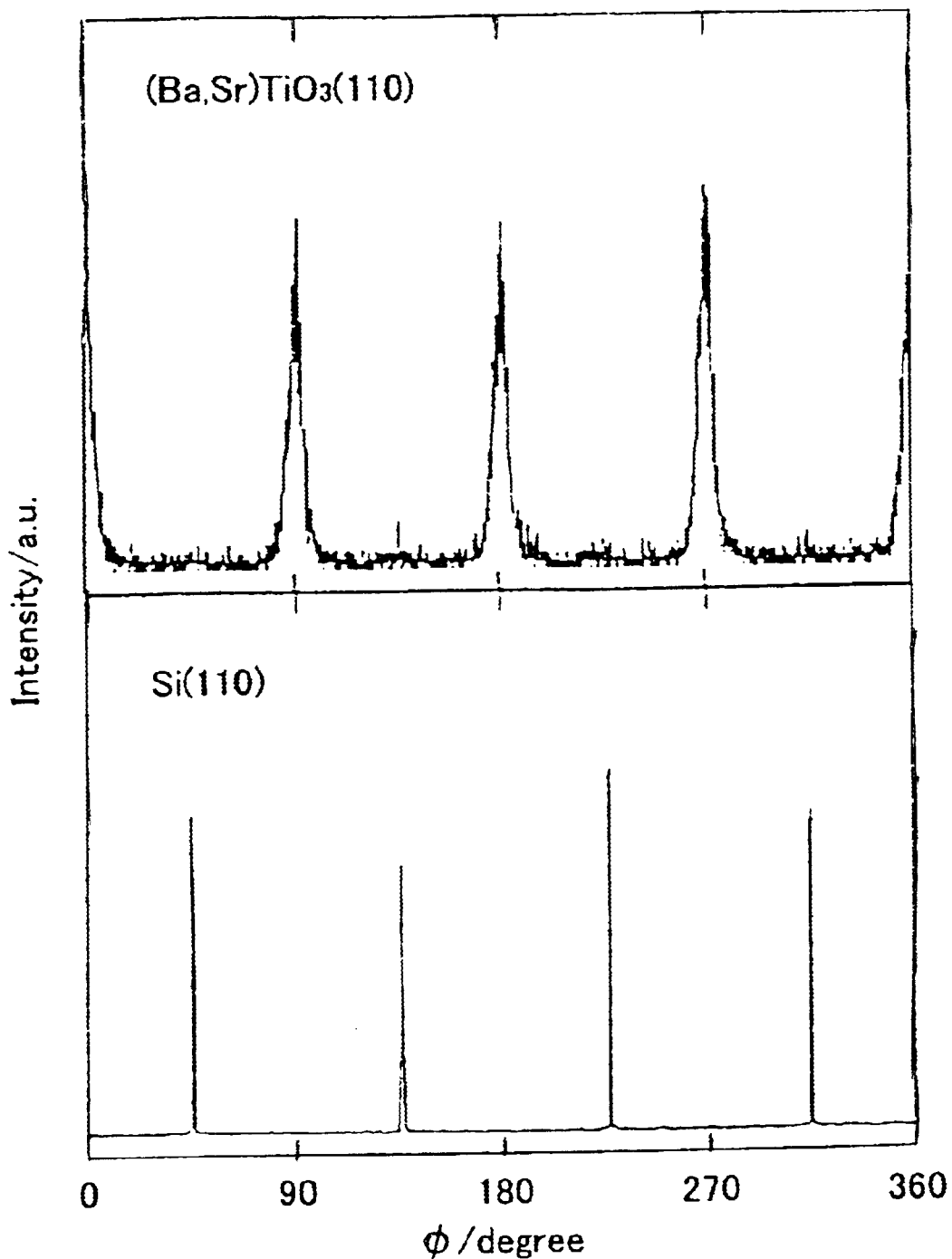
FIG. 9 shows X-ray diffraction patterns obtained with the structure shown in FIG. 6C.

FIG. 9 shows the comparison results of rotation angles φ in the X-ray pole pattern measurement of FIG. 8 conducted on the silicon substrate 51 and the (011)-plane of the (Ba, Sr)TiO₃ film 64.

As shown in FIG. 9, the (011)-plane of the (Ba, Sr)TiO₃ film 64 is shifted from the (011)-plane of the silicon substrate 51 by approximately 45 degrees, and the relationship described with reference to FIG. 1 is established between the silicon substrate 51 and the (Ba, Sr)TiO₃ film 64.

Third Embodiment

FIGS. 10A through 10D shows an epitaxial growth process of a single-crystal $BaTiO_3$ film on a single-crystal silicon substrate in accordance with a third embodiment of the present invention. In the drawings, the same components as in the foregoing embodiments are denoted by the same reference numerals as well, and explanations for those components are omitted from the following description.

Figure 10:
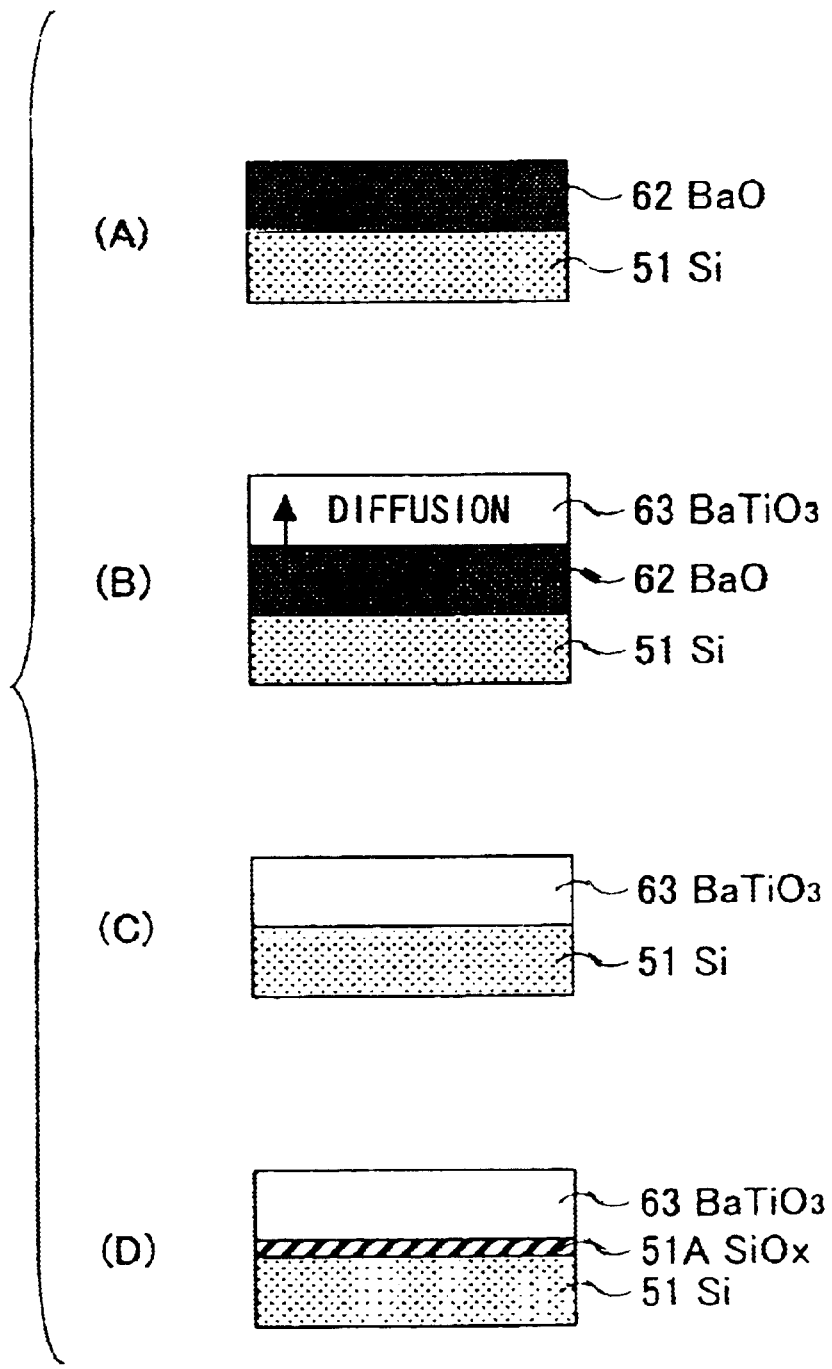
FIGS. 10A through 10D illustrate a process for forming a $BaTiO_3$ epitaxial film on a single-crystal silicon substrate, with a SiOx film interposed in between, in accordance with a third embodiment of the present invention.

Referring to FIG. 10A, a BaO film 62 having a thickness of 5 to 6 nm is deposited on a silicon substrate film 51 from which a natural oxide film has been removed through a HF process, by a pulse laser deposition technique using a $BaCO_3$ target as the target 15 shown in FIG. 2. In a procedure shown in FIG. 10B, a $BaTiO_3$ film 63 having a thickness of 200 nm is deposited on the BaO film 62 by a pulse laser deposition technique using a $BaTiO_3$ target as the target 15. During the procedures shown in FIGS. 10A and 10B, the heaters 12A and 12B are driven so as to maintain the substrate 13, the target 15, and the plume 14 at 800° C. In the procedure shown in FIG. 10A, the $BaCO_3$ target is subjected to laser ablation under a pressure of $5 \times 10^{-6}$ Torr for 1 minute and then in an oxygen atmosphere of $1 \times 10^{-2}$ Torr for 2 minutes. In the procedure shown in FIG. 10B, the laser ablation is performed in an oxygen atmosphere of $1 \times 10^{-2}$ Torr for 10 minutes.

In this manner, the Ba in the BaO film 62 diffuses toward the $BaTiO_3$ film 63 deposited thereon, as indicated by the arrow in FIG. 10B. As a result, the Bao film 62 substantially disappears, and a single-crystal $BaTiO_3$ film 64 that is uniform in appearance is formed on the silicon substrate 51, as shown in FIG. 10C, with an epitaxial relationship being maintained between the silicon substrate 51 and the single-crystal $BaTiO_3$ film 64.

In this embodiment, the structure shown in FIG. 10C is further subjected to heat treatment in an oxygen atmosphere at 1100° C. for 5 hours. As a result, an amorphous-phase SiOx layer 51A having a thickness of approximately 50 nm is formed between the $BaTiO_3$ film 63 and the silicon substrate 51, as shown in FIG. 10D.

As described above, in accordance with this embodiment, a $BaTiO_3$ film can be formed through epitaxial growth on a single-crystal silicon substrate, with an amorphous-phase SiOx layer being interposed in between.

Fourth Embodiment

FIGS. 11A through 11D illustrate an gore, epitaxial growth process of a single-crystal $SrTiO_3$ film on a single-crystal silicon substrate in accordance with a fourth embodiment of the present invention. In the drawings, the same components as in the foregoing embodiments are denoted by the same reference numerals, and explanations for those components are omitted from the following description.

Figure 11:
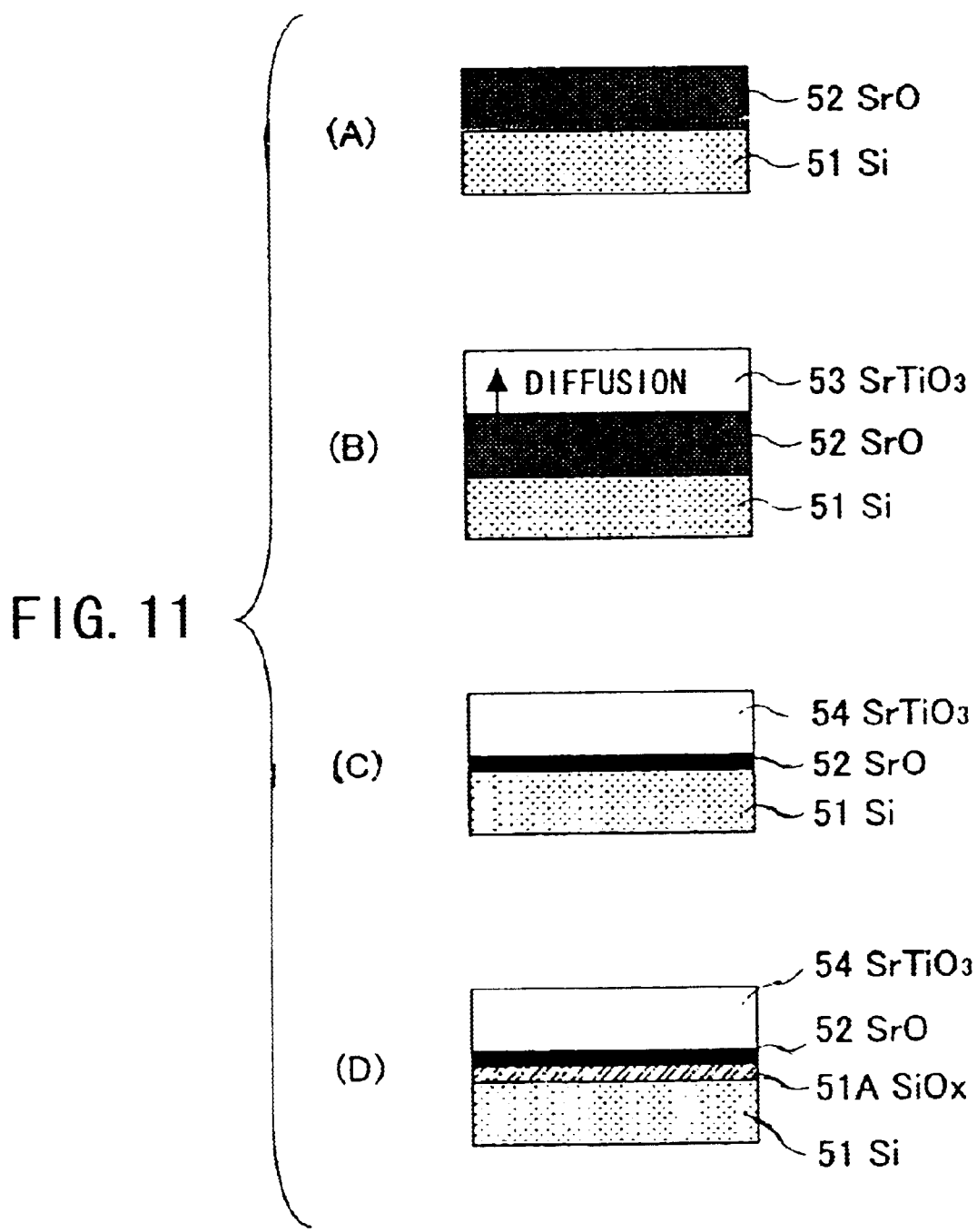
FIGS. 11A through 11D illustrate a process for forming a $SrTiO_3$ epitaxial film on a single-crystal silicon substrate, with a SiOx film and a SrO epitaxial film interposed in between, in accordance with a fourth embodiment of the present invention.

Referring to FIG. 11A, a SrO film 52 is deposited on a silicon substrate 51 from which a natural oxide film is removed through a HF process, by a pulse laser deposition technique using a $SrCO_3$ target as the target 15 shown in FIG. 2. More specifically, the substrate 13, the target 15, and the plume 14 of the laser ablation device 1 are maintained at 800° C., and the $SrCO_3$ target is subjected to laser ablation under a pressure of $1 \times 10^{-5}$ Torr for 1 minute and then in an oxygen atmosphere of $5 \times 10^{-4}$ Torr for 8 minutes, thereby producing the SrO film 52. In a procedure shown in FIG. 11B, by a pulse laser deposition technique using a $SrTiO_3$ target as the target 15, laser ablation is performed in an oxygen atmosphere of $5 \times 10^{-4}$ Torr for 10 minutes, so as to deposit a $SrTiO_3$ film 53 on the SrO film 52. During the procedures shown in FIGS. 11A and 11B, the heaters 12A and 12B are driven so as to maintain the substrate 13, the target 15, and the plume 14 at 800° C.

In this embodiment, the Sr in the SrO film 52 diffuses toward the $SrTiO_3$ film 53, as indicated by the arrow in FIG. 11B. However, the SrO film 52 does not completely disappear, but remain as an epitaxial single-crystal film between a $SrTiO_3$ film 54 and the silicon substrate 51, as shown in FIG. 11C.

Figure 12:
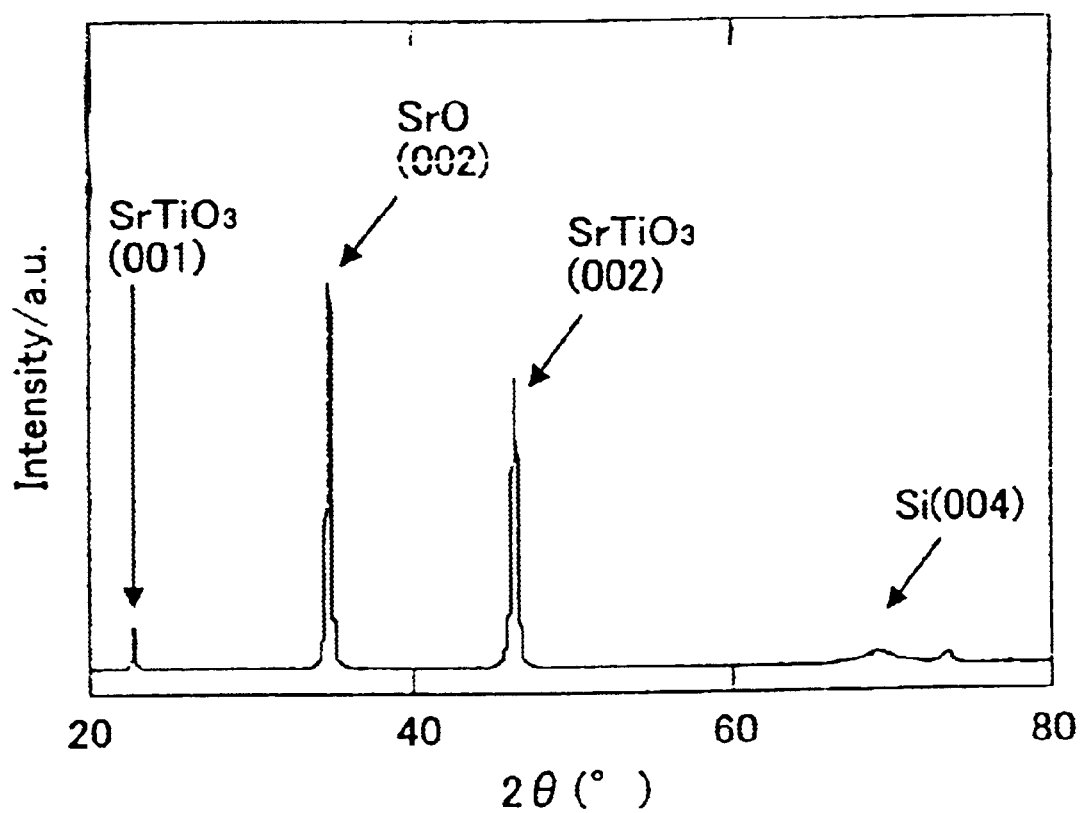
FIG. 12 shows an X-ray diffraction pattern obtained with the structure shown FIG. 11D.

FIG. 12 shows an X-ray diffraction pattern measured with respect to the structure shown in FIG. 11C.

In FIG. 12, the reflection from the (002)-plane of the SrO is observed as well as the reflections from the (001)-plane and (002)-plane of the $SrTiO_3$. This indicates that the structure shown in FIG. 11C has a lamination structure of a SrO film and a $SrTiO_3$ film.

Figure 13:
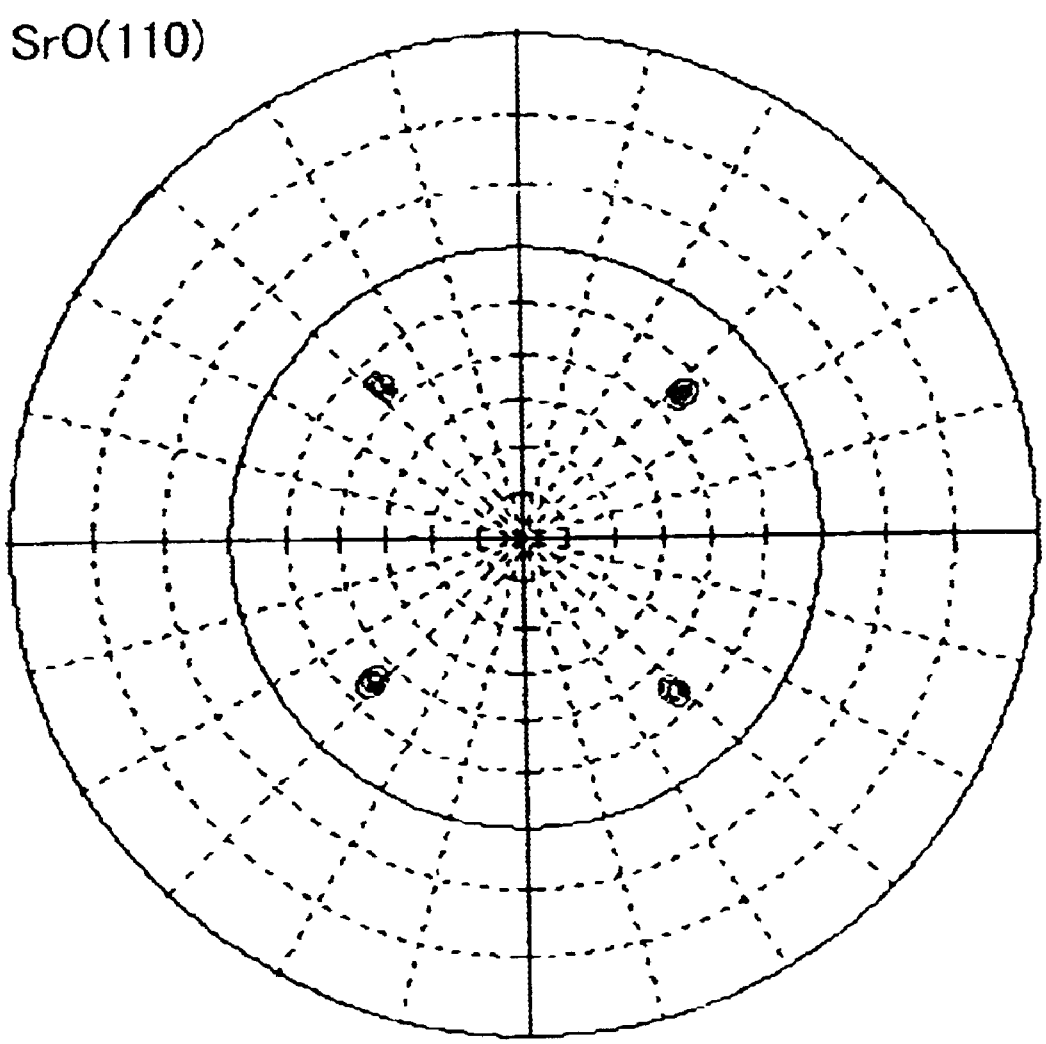
FIG. 13 shows an X-ray pole pattern obtained with the structure shown in FIG. 11A.

FIG. 13 shows the results of X-ray pole measurement conducted on the structure shown in FIG. 11C.

The X-ray pole pattern shown in FIG. 13 is obtained through measurement of the (011)-diffraction peak of the SrO film 52, and shows four poles corresponding to the (011)-plane. This clearly indicates that the obtained SrO film 52 is a single-crystal film and has four rotation symmetry axes. It can also be seen from FIG. 13 that the SrO film 52 does not has twin crystals formed therein.

Figure 14:
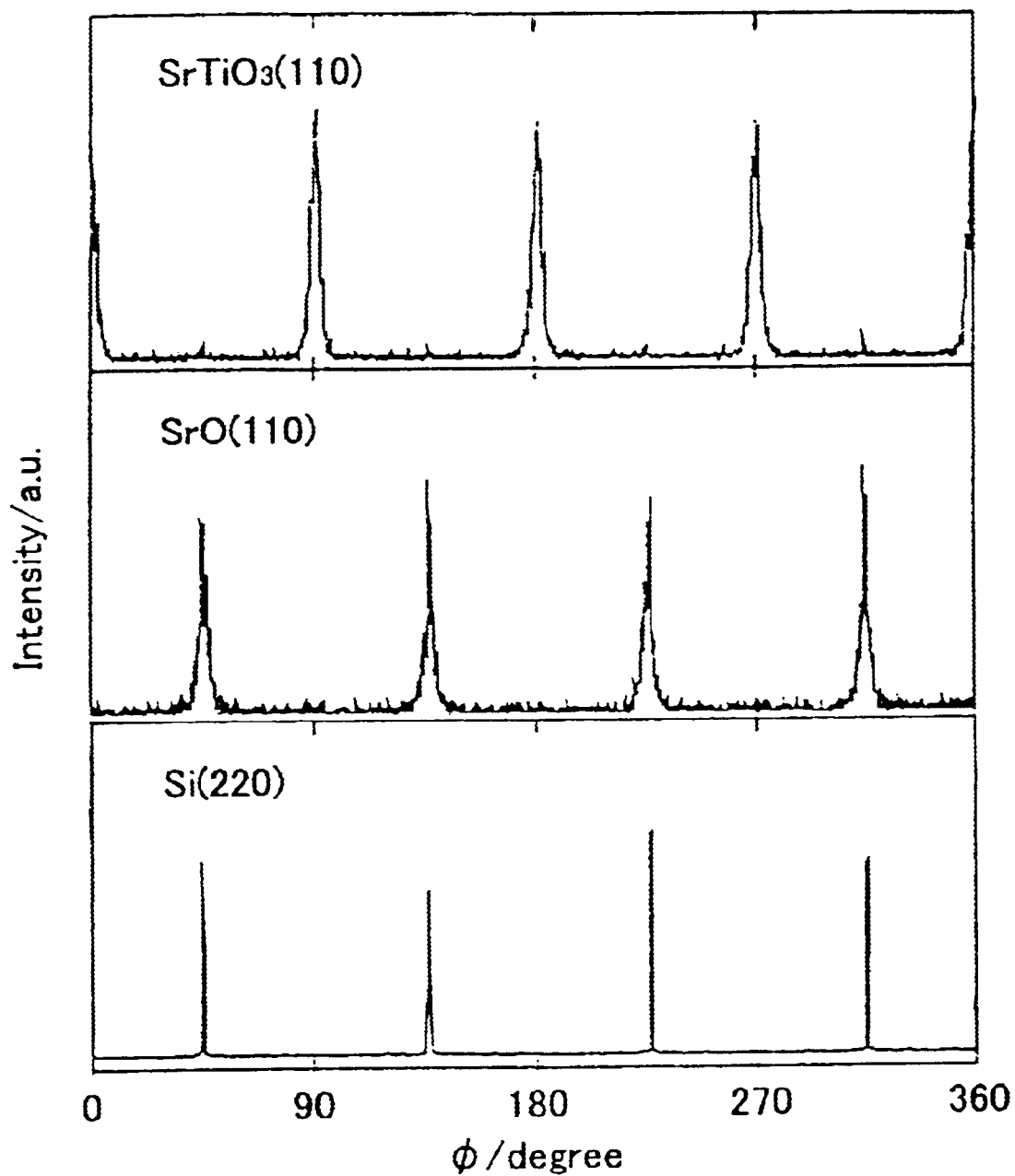
FIG. 14 shows X-ray diffraction patterns obtained with the structure shown in FIG. 11D.

FIG. 14 shows comparison results of rotational angles φ through the X-ray pole pattern measurement conducted on the silicon substrate 51, the SrO film 52, and the (011)-plane of the $SrTiO_3$ film 54.

As can be seen from FIG. 14, the (022)-plane of the silicon substrate 51 completely corresponds to the (011)-plane of the SrO film 52, and the cube-on-cube relationship shown in FIG. 1 is established. Meanwhile, the (011)-plane of the SrO film 52 and the (011)-plane of the $SrTiO_3$ film are shifted from each other by approximately 45 degrees.

In this embodiment, the structure shown in FIG. 11C is further subjected to heat treatment in an oxygen atmosphere at 1100° C. for 5 hours. As a result, an amorphous-phase SiOx layer 51A having a thickness of approximately 50 nm is formed between the SrO film 52 and the silicon substrate 51, as shown in FIG. 11D.

In the above manner, in accordance with this embodiment, a $SrTiO_3$ film can be formed through epitaxial growth on a single-crystal silicon substrate, with an amorphous-phase SiOx layer being interposed in between.

Fifth Embodiment

Figure 15:
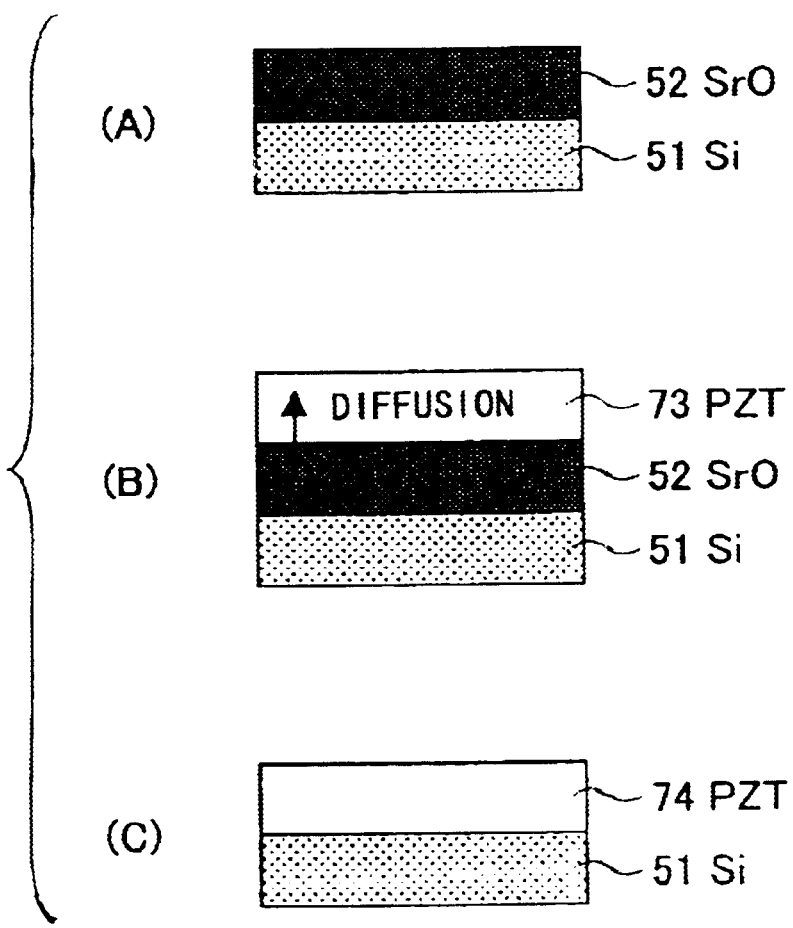
FIGS. 15A through 15C illustrate a process for forming a PZT epitaxial film on a single-crystal silicon substrate in accordance with a fifth embodiment of the present invention.

FIGS. 15A through 15C illustrate an epitaxial growth process of a single-crystal PZT (Pb (Zr, Ti) O₃) film on a single-crystal silicon substrate in accordance with a fifth embodiment of the present invention. In the drawings, the same components as in the foregoing embodiments are denoted by the same reference numerals as well, and explanations for those components are omitted from the following description.

Referring to FIG. 15A, a SrO film 52 is formed on a silicon substrate 51 by a pulse laser deposition technique using a $SrCO_3$ target. More specifically, the substrate temperature, the target temperature, and the plume temperature are set at 800° C., and laser ablation in accordance with the pulse laser deposition technique is performed under a pressure of $1 \times 10^{-6}$ Torr for 1 minute and then in an oxygen atmosphere of $5 \times 10^{-4}$ Torr for 1 minute, thereby producing the SrO film 52.

In the next procedure shown in FIG. 15B, the target is changed to PZT, and the laser ablation in accordance with the pulse laser deposition technique is performed in an oxygen atmosphere of $1 \times 10^{-1}$ Torr, so as to form a PZT film 73 on the SrO film 52.

At the time of deposition of the PZT film 73, the Sr in the SrO film 52 diffuses toward the PZT film 73, as indicated by the arrow in FIG. 15B. As a result, a PZT film 74 is formed and located directly in contact with the silicon substrate 51, as shown in FIG. 15C, with an epitaxial relationship being maintained in between.

Sixth Embodiment

Figure 16:
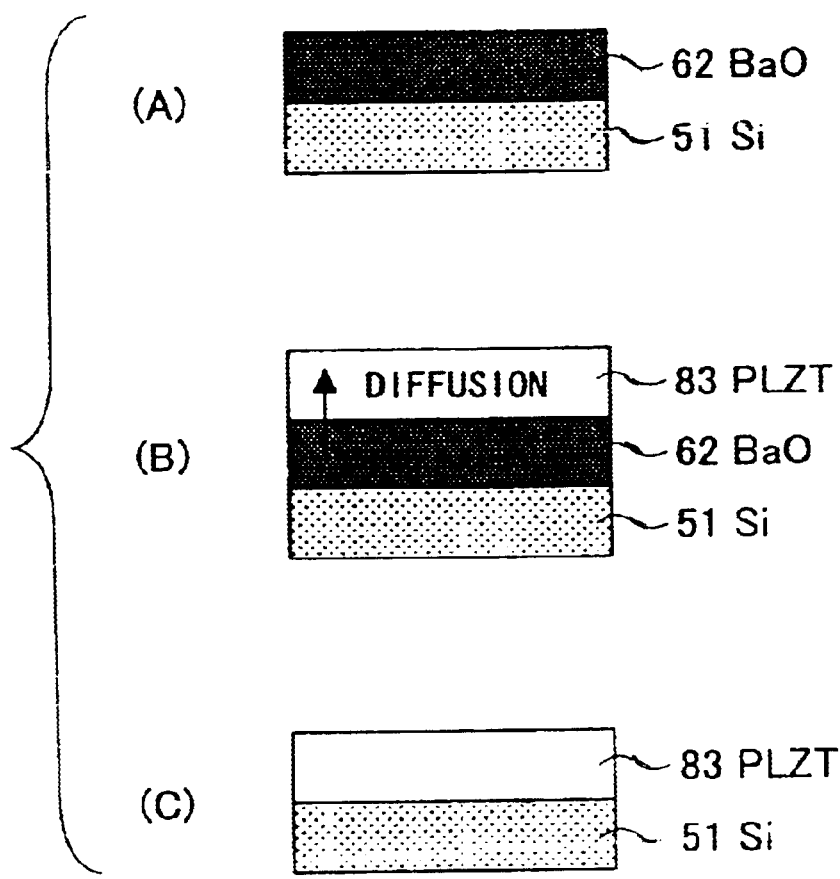
FIGS. 16A through 16C illustrate a process for forming a PLZT film on a single-crystal silicon substrate in accordance with a sixth embodiment of the present invention.

FIGS. 16A through 16C illustrate an epitaxial growth process of a single-crystal PLZT((Pb, La) (Zr, Ti) $O_3$) film on a single-crystal silicon substrate in accordance with a sixth embodiment of the present invention. In the drawings, the same components as in the foregoing embodiments are indicated by the same reference numerals as well, and explanations for those components are omitted from the following description.

Referring to FIG. 16A, a BaO film 62 is formed on a silicon substrate 51 by a pulse laser deposition technique using a $BaCO_3$ target. More specifically, the substrate temperature, the target temperature, the plume temperature are set at 800° C., and laser ablation in accordance with the pulse laser deposition technique is performed under a pressure of $5 \times 10^{-6}$ Torr for 2 minutes and then in an oxygen atmosphere of $1 \times 10^{-2}$ Torr for 8 minutes, thereby producing the BaO film 62.

In the next procedure shown in FIG. 16B, the target is changed to PLZT, and the laser ablation according to the pulse laser deposition technique is performed by an oxygen atmosphere of $1 \times 10^{-1}$ Torr, so as to form a PLZT film 83 on the BaO film 62.

At the time of deposition of the PLZT film 83, the Ba in the BaO film 62 diffuses toward the PLZT film 83, as indicated by the arrow in FIG. 16B. As a result, a PLZT film 84 is formed and located directly in contact with the silicon substrate 51, as shown in FIG. 16C, with an epitaxial relationship being maintained in between.

In the above embodiments, the single-crystal oxide films having sodium chloride structures are not limited to a SrO film and a BaO film, but an MgO film or a CaO film can also be employed. When a single-crystal MgO film is to be formed, a $MgCO_3$ target should be used in the laser ablation device of FIG. 2. When a single-crystal CaO film is to be formed, a $CaCO_3$ target should be used.

Also in the above embodiments, the perovskite single-crystal oxide thin films are not limited to a $SrTiO_3$ film, a $BaSrTiO_3$ film, a (Ba, Sr) $TiO_3$ film, a $SrRuO_3$ film, a PZT film, and a PLZT film, but a film containing Mg or Ca as a bivalent metal can also be employed. Alternatively, the perovskite single-crystal oxide films may contain Ag, Al, Ba, Bi, Ca, Ce, Cd, Co, Cu, Dy, Eu, Fe, Ga, Gd, Hf, I, In, La, Li, Mn, Mo, Na, Nb, Ni, Os, Pa, Pb, Pr, Re, Rh, Sb, Sc, Sm, Sn, Sr, Ta, Te, Th, Tl, U, V, W, Y, Sm, Yb, or Zr.

Seventh Embodiment

Figure 17:
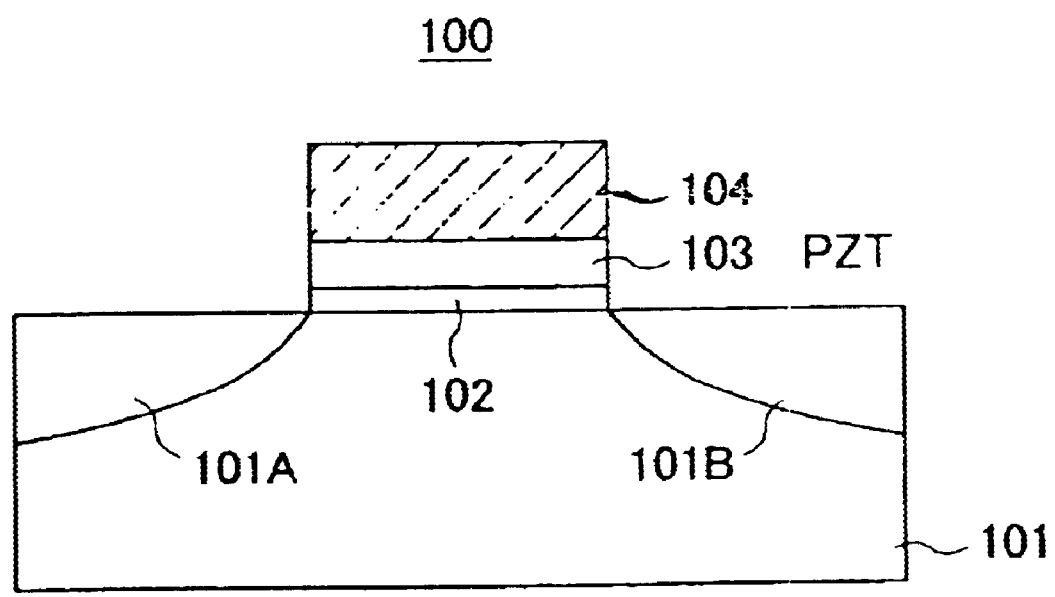
FIG. 17 shows the structure of a FeRAM in accordance with a seventh embodiment of the present invention.

FIG. 17 shows the structure of a ferroelectric memory (FeRAM) 100 in accordance with a seventh embodiment of the present invention.

As shown in FIG. 17, the FeRAM 100 is formed on a single-crystal substrate 101, and contains a single-crystal PZT film 103 formed through epitaxial growth on the single-crystal silicon substrate 101, with a SiOx thin film 102 being interposed in between, and a Pt gate electrode 104 formed on the single-crystal PZT film 103. In the single-crystal silicon substrate 101, an N-type or p-type diffusion regions 101A and 101B are formed in such positions as to flank the area corresponding to the Pt gate electrode 104.

In this FeRAM 100, a write voltage is applied to the gate electrode 104, so that polarization is induced in the single-crystal PZT film 103 to change the threshold voltage of the transistor.

At a time of reading, a read voltage is applied to the gate electrode 104, and the conductance between the diffusion regions 101A and 101B is detected. By doing so, information written in the form of remanence in the PZT film 103 can be read out.

In accordance with this embodiment, the single-crystal PZT film has such an orientation that the c-axis direction is perpendicular to the principal plane while the polarization occurs in the c-axis direction. With this structure, the maximum value of the remanence is obtained. Accordingly, the write voltage can be minimized in this FeRAM.

It should be noted that the present invention is not limited to the embodiments specifically disclosed above, but other variations and modifications may be made without departing from the scope of the present invention.

What is claimed is:

1. A semiconductor device comprising:

a single-crystal silicon substrate; and a single-crystal oxide thin film having a perovskite structure formed through epitaxial growth on the single-crystal silicon substrate, said single-crystal oxide thin film being directly in contact with a surface of the single-crystal silicon substrate, and containing a bivalent metal that is reactive to silicon.

2. The semiconductor device as claimed in claim 1, wherein the bivalent metal is any bivalent metal but Sr.

3. The semiconductor device as claimed in claim 1, wherein the single-crystal oxide thin film is selected from the group consisting of $PbTiO_3$, $PbZrO_3$, $Pb(Zr, Ti)O_3$, $(Pb, La) (Zr, Ti)O_3$, $BaTiO_3$, and $(Ba, Sr)TiO_3$.

4. A semiconductor device comprising:

a single-crystal silicon substrate;

a single-crystal oxide thin film having a perovskite structure formed through epitaxial growth on the single-crystal silicon substrate; and an amorphous silicon layer interposed between the single-crystal silicon substrate and the single-crystal oxide thin film.

5. The semiconductor device as claimed in claim 4, wherein the single-crystal oxide thin film contains a bivalent metal selected from the group consisting of Sr, Ba, Pb, and La.

6. The semiconductor device as claimed in claim 4, wherein the single-crystal oxide thin film is selected from the group consisting of $PbTiO_3$, $PbZrO_3$, $Pb(Zr, Ti)O_3$, $(Pb, La) (Zr, Ti)O_3$, $BaTiO_3$, $(Ba, Sr)TiO_3$, and $SrTiO_3$.

* * * * *